United States Patent

Egawa et al.

[11] Patent Number: 5,992,725
[45] Date of Patent: Nov. 30, 1999

[54] APPARATUS AND METHOD FOR PRODUCING ELECTRONIC ELEMENTS

[75] Inventors: Hidemitsu Egawa; Hirokazu Ezawa, both of Tokyo, Japan

[73] Assignee: Kabushiki Kaisha Toshiba, Japan

[21] Appl. No.: 08/815,844

[22] Filed: Mar. 12, 1997

[30] Foreign Application Priority Data

Mar. 13, 1996 [JP] Japan ................................. 8-055977

[51] Int. Cl.⁶ .......................... H05K 13/06; H01L 21/60
[52] U.S. Cl. .............................. 228/4.5; 228/41; 228/52; 228/111.5; 228/244
[58] Field of Search ................... 228/180.5, 4.5, 228/244, 245, 248.1, 256

[56] References Cited

U.S. PATENT DOCUMENTS

| | | | |
|---|---|---|---|
| 3,672,047 | 6/1972 | Sakamoto et al. | 228/180.5 |
| 4,315,128 | 2/1982 | Matcovich et al. | 228/4.5 |
| 4,564,734 | 1/1986 | Okikawa | 219/56.22 |
| 4,598,855 | 7/1986 | Bell et al. | 228/52 |
| 4,765,526 | 8/1988 | Sato | 228/4.5 |
| 5,328,078 | 7/1994 | Okumura | 228/248.1 |
| 5,735,451 | 4/1998 | Mori et al. | 228/42 |

FOREIGN PATENT DOCUMENTS 042511945  9/1992  Japan ................................. 228/261

*Primary Examiner*—Samuel M. Heinrich
*Attorney, Agent, or Firm*—Finnegan, Henderson, Farabow, Garrett & Dunner, L.L.P.

[57] ABSTRACT

An electronic element producing apparatus comprises a bonding tool 1 which has a first supply hole 2 for passing a bonding wire 3 used to bond a bonding pad 6 of a semiconductor device 5 and an external conductor which is to be connected electrically with the bonding pad 6, and contacts a leading end 3b of the bonding wire 3 protruded outside from the first supply hole 2 to the bonding pad 6, and which also has a second supply hole 12 to supply a bonding material to bond the bonding pad 6 and the leading end 3b of the bonding wire 3, the second supply hole 12 being formed to supply the conductive material to a contact point between the bonding wire 3 and the bonding pad 6. Therefore, the bonding pad 6 and the bonding wire 3 can be bonded without applying a dynamic or thermal load to the semiconductor device 5.

8 Claims, 4 Drawing Sheets

APPARATUS AND METHOD FOR PRODUCING ELECTRONIC ELEMENTS

BACKGROUND OF THE INVENTION

1. Field of the Invention

The invention relates to an apparatus and method for producing electronic elements, and more particularly to an apparatus for fixing a conductive wire such as a bonding wire to a bonding pad of electronic elements and to a method thereof. In addition, the invention relates to an electronic elements producing apparatus which is used to connect bonding pads of an electronic element such as a semiconductor device and leads of a package in which the electronic element is packaged with a thin metal wire, and to a method thereof.

2. Description of the Related Art

Generally, to protect electronic elements such as a semiconductor device from external environments, the semiconductor device is packaged. To supply electric power to the semiconductor device or to input or output a signal to or from the semiconductor device, it is necessary to electrically connect a bonding pad which is formed on the semiconductor device and external terminals such as lead terminals of the package. A wire bonding method is one of methods for effecting such connections. This method mounts a semiconductor device on, e.g., a lead frame which has a plurality of leads and connects the bonding pad on the semiconductor device and the leads with a bonding wire of, e.g., Al or Au.

FIG. 4A and FIG. 4B are diagrams showing an example of the connecting step of the bonding wire and the bonding pad in a conventional wire bonding method. These drawings are partly enlarged sectional views showing the leading end of a bonding tool and the bonding pad of a semiconductor device. It is shown that a bonding pad 96 is formed on a semiconductor device 95, and a bonding wire 93 is being bonded to the bonding pad 96.

As shown in FIG. 4A, the bonding wire 93 is passed through a through hole 92 of a bonding tool 91 which is generally called a capillary, and the leading end of the bonding wire 93 protruded from the through hole 92 has a ball 93b formed by, e.g., an electrical spark. This ball 93b prevents the bonding wire 93 from being pulled into the through hole 92 when the capillary 91 is being moved. And, by forming the ball 93b, a contact area between the bonding wire 93 and the bonding pad 96 can be enlarged to enhance a bonding strength when the ball 93b is pressed against the bonding pad 96.

The capillary 91 is lowered to contact the ball 93b onto the bonding pad 96 as shown in FIG. 4B. And, heat or ultrasonic oscillation is applied to the bonding pad 96 via the capillary 91, and the ball 93b is pressed against the bonding pad 96 by the capillary 91 at the same time. New surfaces are formed on the squashed ball 93c and the bonding pad 96 by th e applied heat or ultrasonic oscillation, and since these new surfaces are mutually contacted, the bonding wire 93 and the bonding pad 96 can be bonded.

But, this conventional bonding method has a disadvantage that the semiconductor device tends to be damaged easily on its portions close to the bonding pad 96 because the bonding pad 96 is directly exposed to an external force such as heat, ultrasonic oscillation or pressure. For example, the disadvantage includes that the bonding pad 96 is separated from an insulator film 97 below the bonding pad 96 and cracks are formed on a semiconductor substrate 98 beneath the bonding pad 96.

And, even when these defects of separation or cracks do not occur during bonding, the semiconductor device 95 which is being used might fail due to an external force which has been applied in the bonding method. Thus, it is difficult to secure satisfactory reliability for the semiconductor device 95.

As described above, the conventional apparatus and method for producing electronic elements had disadvantages that the semiconductor device 95 tends to be damaged easily on its portions close to the bonding pad due to the external force such as heat and ultrasonic oscillation or pressure and that a failure occurs during bonding or even after completing the product.

An object of the invention is to provide an electronic elements producing apparatus and method which can reduce an external force to be applied to the electronic elements and connect a bonding pad and a bonding wire without damaging the electronic elements such as a semiconductor device.

And, another object of the invention is to provide an apparatus and method for producing electronic elements with high productivity which can connect a bonding pad and a bonding wire with a connecting material in a shorter time.

SUMMARY OF THE INVENTION

To remedy the above-described disadvantages, the present invention includes the following aspects.

A first aspect of the invention relates to an electronic element producing apparatus to connect a conductive wire to a bonding pad of an electronic element, which comprises a first means for supplying the wire to the bonding pad in substantially parallel to the normal direction of the bonding pad and contacting the leading end of the wire to the bonding pad; and a second means for supplying a bonding material into the neighborhood where the wire and the bonding pad are contacted so as to bond the wire and the bonding pad when they are contacted.

A second aspect of the invention relates to an electronic element producing apparatus to connect a conductive wire to bonding pads of an electronic element, which comprises a bonding tool having an approximately cylindrical shape with its center axis in substantially parallel to the normal direction of the bonding pad of the electronic element, the bonding tool having a first supply hole which is formed along the center axis to supply the wire to the bonding pad so as to contact the leading end of the wire to the bonding pad; and the bonding tool having at least one second supply hole formed so as to supply a bonding material to bond the wire and the bonding pad when they are contacted, into the neighborhood where the wire and the bonding pad are contacted; and a holding means for holding the electronic element so to face the bonding pad to the bonding tool.

In the electronic element producing apparatus configured as described above according to the invention, the bonding tool has multiple second supply holes, and the openings of the second supply holes are formed symmetrical about the opening of the first supply hole on the end face of the bonding tool.

And, in another embodiment of the bonding tool, the second supply hole of the bonding tool is only a single hole, and the opening of the second supply hole is formed along the circumference about the opening of the first supply hole on the end face of the bonding tool.

As an embodiment of the bonding tool having the second supply holes, when the wire and the bonding pad are contacted with the axis of the first supply hole being substantially parallel with the normal direction of the bonding pad, the second supply holes are formed along a circular cone with the contacted point as a vertex. In this case, the at least one second supply hole may be only a single hole or multiple holes. And, where it is configured that when the wire is contacted to the bonding pad, a bonding material, which bonds the wire and the bonding pad, is supplied into the neighborhood where the wire and the bonding pad are contacted, the at least one second supply hole is not required to be formed in a plane passing through the center axis of the bonding tool, and may be formed in a spiral shape around the first supply hole. And, multiple second supply holes can divide the circular cone in a circumferential direction. Alternatively, one second supply hole can also be formed on the whole surface of the circular cone.

The bonding material to be used in the electronic element producing apparatus of the invention can be ultra-fine particles, super-fine particles or conductive paste made of a conductive material. Therefore, the electronic element producing apparatus of the invention may be provided with another means for supplying the bonding material into the other end of the second supplying hole.

For example, as an embodiment of the electronic element producing apparatus of the invention, another means may be provided to supply conductive ultra-fine particles or super-fine particles as the bonding material to the second supply hole, and the second supply hole is formed so as to deposit the ultra-fine particles in the neighborhood of the contact point between the bonding pad and the wire. For example, a metal such as Au or Pt may be vaporized in a non-oxidizing atmosphere to produce ultra-fine particles and to introduce them into the second supply hole. By setting a pressure in a chamber for producing the ultra-fine particles to be higher than a pressure in the second supply hole on the side to come close to the bonding pad of the electronic element, the ultra-fine particles are supplied from the second supply hole to be accumulated in the neighborhood of a point where the bonding wire and the bonding pad are contacted.

As still another embodiment of the electronic element producing apparatus of the invention, another means may be provided to supply a conductive paste as the bonding material to the second supply hole, and the second supply hole is formed so as to deposit the conductive paste in the neighborhood of the contact point between the bonding pad and the wire. One example of the conductive paste is a conductive paste containing Au or Pt. It is also possible to contain other conductive material such as Ag, Pd, Sn, Ni, Bi, Pd, In.

This means for supplying the bonding material may be formed to be connected to the bonding tool or formed into one body with it.

To prevent jamming of the bonding material or its difficulty of passing in the second supply hole, the bonding tool may be provided with a heating means for heating the periphery of the second supply hole to keep the fluidity of the bonding material through the second supply hole.

Thus, in the apparatus for producing a semiconductor device of the invention, since the bonding tool is provided with the second supply hole for supplying the bonding material to bond the bonding pad and the leading end of the bonding wire, the bonding pad and the leading end of the bonding wire can be bonded with the bonding material supplied from the second supply hole. Since the bonding pad and the leading end of the bonding wire are bonded as described above, it is not necessary to apply an external force such as heat or ultrasonic oscillation. And, it is possible to prevent possible damage to the semiconductor device on its part close to the bonding pad due to the external force.

And, since the second supply hole is formed in a direction that the bonding material is supplied to a contact point between the bonding wire and the bonding pad, the bonding material supplied from the second supply hole is applied to a point close to the contact point between the bonding wire and the bonding pad, so that the bonding wire and the bonding pad can be bonded securely.

And, the first means and the second means are characterized in that their relative positional relation is fixed. By fixing the positional relation between the bonding wire and the bonding pad, the bonding material can be supplied into the neighborhood of their contact point without requiring alignment when the leading end of the wire is contacted to the bonding pad of an electronic element. Therefore, the bonding material can be supplied uniformly, and the bonding strength between the bonding pad and the wire can be improved. Besides, since alignment is not required to supply the bonding material, productivity is improved. Generally, each semiconductor device has a number of bonding pads to be bonded, and automatic alignment is particularly effective to improve productivity.

In addition, in the semiconductor device producing apparatus according to the invention, when the bonding wire and the bonding pad are contacted with the axis of the first supply hole being substantially parallel with the normal direction of the bonding pad, the second supply hole is formed along a circular cone with the contacted point as a vertex, the bonding material supplied from the second supply hole can be supplied into the neighborhood of the contacted point between the bonding wire and the bonding pad, and the bonding wire and the bonding pad can be bonded securely. Especially, since the relative position between the first supply hole and the second supply hole is fixed, the bonding material supplied from the second supply hole can be supplied to a predetermined point with respect to the bonding wire supplied from the first supply hole.

And, in the semiconductor device producing apparatus according to the invention that the bonding tool is provided with a plurality of second supply holes which are formed to divide the circular cone in a circumferential direction, the bonding material is supplied to a plurality of points and separately supplied around the contact point between the leading end of the bonding wire and the bonding pad, so that the bonding force between the bonding wire and the bonding pad can be enhanced. Especially, when the plurality of second supply holes are formed to equally divide the circular cone in the circumference direction, the bonding material is equally supplied around the contact point between the leading end of the bonding wire and the bonding pad, thereby improving bonding reliability.

And, in the semiconductor device producing apparatus according to the invention that the second supply hole is formed in the form of a groove on the whole surface of the circular cone, the bonding material can be supplied to fully surround the contact point between the leading end of the bonding wire and the bonding pad, thereby further enhancing the bonding force.

Besides, in the semiconductor device producing apparatus according to the invention provided with the means for supplying the ultra-fine metal particles as the bonding material from the second supply hole, the ultra-fine metal particles are linearly supplied from the second supply hole to the contact point between the leading end of the bonding wire and the bonding pad, so that the ultra-fine metal particles as the bonding material can be supplied more accurately.

In the semiconductor device producing apparatus according to the invention provided with means for dripping a conductive paste as the bonding material from the second supply hole, the conductive paste generally has high fluidity and can be supplied not only to the aimed point, but also to a part behind the leading end of the bonding wire. Thus, the bonding material can be supplied to cover the entire periphery of the contact point between the leading end of the bonding wire and the bonding pad, and the bonding force can be enhanced.

Especially, when the conductive paste contains Au or Pt, such a precious metal is not oxidized readily, and bonding reliability between the bonding wire and the bonding pad can be improved.

A third aspect of the invention is an electronic element producing method for connecting bonding pads of an electronic element and an external conductor with a conductive wire, which comprises steps of holding to protrude the leading end of the wire from the leading end of a bonding tool having a first supply hole through which the wire is passed and contacting the leading end of the wire to the bonding pad; and supplying a bonding material from a second supply hole which is at least one and formed on the bonding tool into the neighborhood of a contact point between the leading end of the wire and the bonding pad thereby bonding the leading end of the wire and the bonding pad with the bonding material.

For example, this producing method may include a step of passing the bonding wire through the first supply hole so that the leading end of the bonding wire protrudes from the leading end of the bonding tool which has the first supply hole through which the bonding wire passes; a step of contacting the protruded leading end of the bonding wire to the bonding pad; and a step of supplying a bonding material from the second supply hole which is formed on the bonding tool into the contact area between the leading end of the bonding wire and the bonding pad thereby bonding the leading end of the bonding wire and the bonding pad with the bonding material.

This step of bonding the bonding pad and the wire may supply conductive ultra-fine particles as the conductive material to the second supply hole to deposit the ultra-fine particles into the neighborhood of the contact point between the bonding pad and the wire to bond them. The ultra-fine particles may be of Au, Pt or the like. And, in addition, ultra-fine particles of another metal, conductive organic compound or a composite material thereof may be used.

Furthermore, the step of bonding the bonding pad and the wire may supply a conductive paste as the bonding material to the second supply hole and deposit the conductive paste into the neighborhood of the contact point between the bonding pad and the wire to bond them. The conductive paste may contain, e.g., Au or Pt, but another conductive resin material may be used.

The step of bonding the bonding pad and the wire preferably supplies the bonding material from the second supply hole to uniformly deposit it around the contact point between the bonding pad and the wire. But, it is not essential to uniformly deposit the bonding material, and it may be accumulated symmetrically about the contact point between the bonding pad and the wire.

For example, when the second supply hole is to be formed at two points, the two second supply holes may be formed to have line symmetry of order two with respect to the contact point, and the bonding material may be supplied from two directions. When the second supply hole is to be formed at three points, the three second supply holes may be formed to have rotational symmetry of order three with respect to the contact point, and the bonding material may be supplied from three directions. Thus, when the number of the second supply holes is n, the second supply holes are formed to have symmetry of order n with respect to the contact point of the bonding pad and the bonding wire, and the bonding material is supplied from n directions. Thus, the bonding material is supplied more uniformly around the contact point of the bonding pad and the bonding wire, enabling to enhance a bonding strength. And, in the present invention, since the first supply hole for supplying the bonding wire and the second supply holes for supplying the bonding material are formed with their mutual positions previously fixed, the bonding material can be accumulated uniformly in the neighborhood of the contact point between the bonding pad and the bonding wire without requiring an aligning step. Therefore, productivity is also improved extensively.

And, in the semiconductor device producing method according to the present invention, after protruding the leading end of the bonding wire from the first supply hole formed on the bonding tool and contacting the leading end to the bonding pad, the bonding material is supplied from the second hole formed on the bonding tool to the contact area between the leading end of the bonding wire and the bonding pad to bond the leading end of the bonding wire and the bonding pad, so that the semiconductor device can be prevented from being damaged by an external force as compared with a conventional producing method which applies an external force such as heat or ultrasonic oscillation to the leading end of the bonding wire through the bonding tool to bond the leading end of the bonding wire and the bonding pad.

Besides, in the above-described semiconductor device producing method, when the ultra-fine metal particles are used as the bonding material and injected from the second supply hole to the contact area between the leading end of the bonding wire and the bonding pad, a direction of injection can be controlled readily and the ultra-fine metal particles as the bonding material can always be supplied to a fixed point, so that the bonding wire and the bonding pad can be bonded securely.

Furthermore, in the above-described semiconductor device producing method, when the conductive paste is used as the bonding material and dripped from the second supply hole to supply the conductive paste to the contact point between the leading end of the bonding wire and the bonding pad, since the conductive paste has high fluidity, the conductive paste can be spread uniformly around the bonding wire to reach its behind with respect to the point where the conductive paste is supplied by an effect of surface tension. Thus, the leading end of the bonding wire can be fully covered with the conductive paste, and the adhesion between the bonding wire and the conductive pad can be improved.

DESCRIPTION OF PREFERRED EMBODIMENTS

Embodiments of the invention will be described with reference to the accompanying drawings.

Figure 1A:
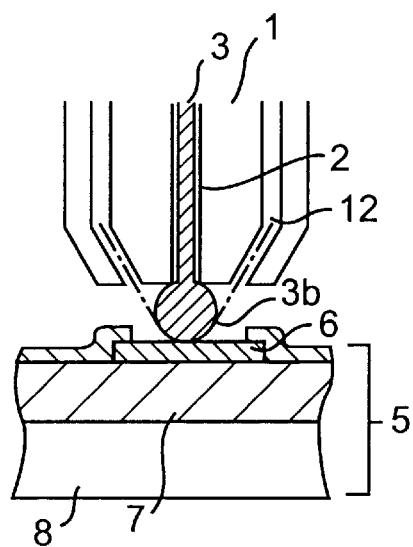
FIG. 1A is a sectional view showing one embodiment of the electronic element producing apparatus of the invention.
Figure 1B:
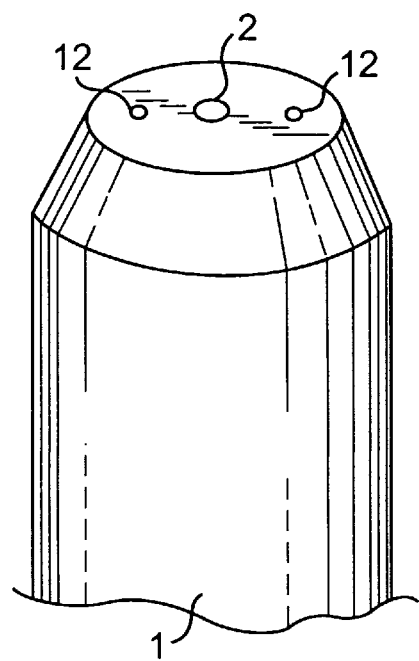
FIG. 1B is a perspective view schematically showing the leading end of the capillary shown in FIG. 1A.

FIG. 1A is a sectional view showing one example of the electronic element producing apparatus of the invention, showing a capillary (bonding tool) 1, a bonding pad 6 and their periphery in an enlarged view. FIG. 1B is a perspective view schematically showing the leading end of the capillary shown in FIG. 1A. And, FIG. 2A and FIG. 2B are diagrams showing the capillary 1 viewed from the side of the bonding pad 6.

As shown in FIG. 1A, the capillary 1 provided for the electronic element producing apparatus of the present invention has a supply hole 2 through which a bonding wire 3 is passed through, and also has second supply holes 12.

In the present invention, the bonding wire 3 and the bonding pad 6 are mutually bonded by injecting or dripping a bonding material around their contacted point without applying a pressure while holding a ball 3b in contact with the bonding pad 6 differing from a conventional thermocompression bonding or ultrasonic welding. The second supply holes 12 are formed at two points in FIG. 1A and used to supply a bonding material to bond the ball 3b and the bonding pad 6. As shown in FIG. 1A, the second supply holes 12 are formed with respect to the first supply hole 2 so that the contacted point between the ball 3b and the bonding pad 6 is located on an extension of the center lines of the second supply holes 12. Specifically, the second supply holes 12 are formed on a circular cone with the contacted point of the ball 3b and the bonding pad 6 as a vertex and the first supply hole 2 as the normal. Thus, the capillary in this embodiment has the second supply holes 12 at a fixed position with respect to the first supply hole 2, and the bonding material can always be supplied to fixed points of the contacted point of the ball 3b and the bonding pad 6. The bonding wire 3 used here has a diameter of about 30 $\mu$m, and the ball 3b has a diameter of about 70 $\mu$m. And, the bonding pad 6 has a diameter or one side length of about 80 to 100 $\mu$m.

Figure 2A:
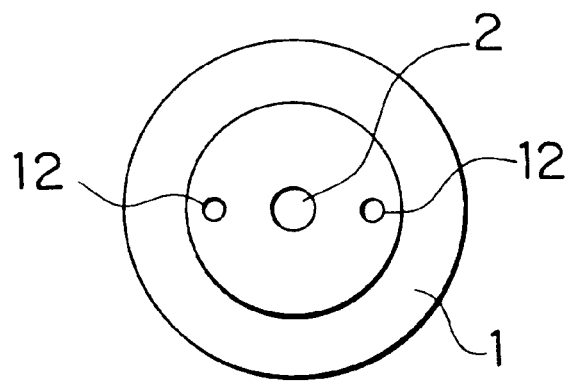
FIG. 2A, FIG. 2B and FIG. 2C are diagrams showing the capillary viewed from the side of a bonding pad.

The second supply holes 12 are preferably formed at points to equally divide the perimeter of a circle about the first supply hole 2 as shown in FIG. 2A. By configuring this way, the bonding material can be distributed uniformly around the contacted point of the ball 3b and the bonding pad 6. For example, when the bonding material has high fluidity, the bonding material can uniformly spread around the ball 3b along a small gap between the ball 3b and the bonding pad 6 by an effect of surface tension, so that the second supply holes 12 are not required to be formed in a large number. On the other hand, when the bonding material does not have high fluidity, the bonding material is hard to spread uniformly around the ball 3b. Then, the second supply holes 12 are desirably formed in a large number from a viewpoint of enhancing the bonding reliability.

Description has been made on the second supply holes 2 which are provided at two points. But, the second supply holes 12 may be formed at three or more points. FIG. 2B is a diagram showing the end face of the bonding tool which is provided with the second supply holes at three points. The three second supply holes 12 are formed almost symmetrically about the first supply hole 2.

Figure 2C:
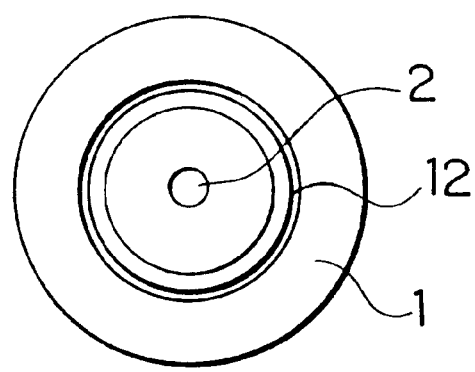
Figure 2B:
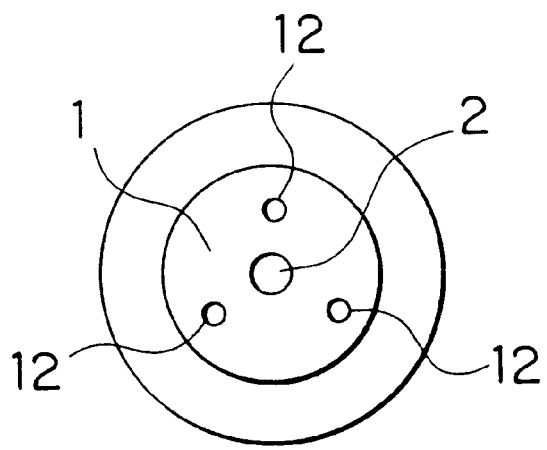

As shown in FIG. 2C, the second supply hole 12 may be formed as a circular groove around the first supply hole 2. By configuring in this way, the bonding material can be distributed uniformly around the ball 3b. Especially, when the bonding material does not have high fluidity and does not spread around the ball 3b as described above, the second supply hole 12 formed to have a circular groove can distribute the bonding material around the ball 3b to securely bond the ball 3b and the bonding pad 6.

Now, description will be made of a method of bonding the bonding wire 3 onto the bonding pad 6 by the apparatus configured as described.

First, in the same way as a conventional method, the bonding wire 3 of Au or Al is passed through the first supply hole 2 which is formed in the capillary 1. And, the leading end of the bonding wire 3 protruded from the supply hole 2 is formed into the ball 3b by, e.g., electrical sparking.

Figure 3A:
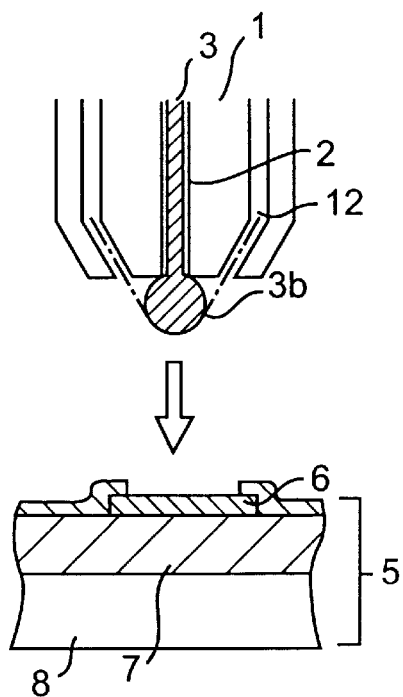
FIG. 3A is a diagram showing a ball 3b at the leading end of a bonding wire 3 protruded from a first supply hole 2 and held by a capillary 1.

A mechanism for causing the electric spark to form the ball 3b can be mounted on, e.g., a holder which holds the capillary 1 and moves it vertically. And, it is possible to prevent the bonding wire 3 from being pulled into the first supply hole 2 by means of a jig for fixing a position of the bonding wire 3 with respect to the capillary 1 without forming the ball 3b. FIG. 3A is a diagram showing the ball 3b at the leading end of the bonding wire 3 protruded from the first supply hole 2 and held by the capillary 1.

Then, the capillary 1 is lowered to contact the ball 3b to the bonding pad 6. FIG. 1A shows that the ball 3b is in contact with the bonding pad 6. In a practical use, the ball 3b may not be required to be in contact with the bonding pad 6 but may be sufficiently positioned close to the bonding pad 6.

In such a state, the bonding material is injected or dripped from the second supply holes 12 toward the contacted face between the ball 3b and the bonding pad 6. The bonding material can be ultra-fine metal particles or a conductive paste. Description will be made of a bonding method using such a bonding material.

Figure 3B:
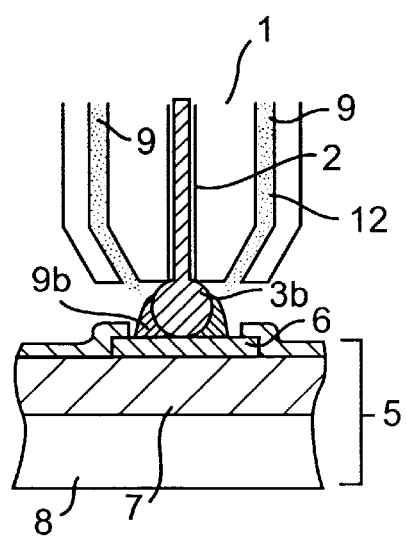
FIG. 3B is a diagram showing a state that a bonding pad 6 is in contact with the ball 3b at the leading end of the bonding wire 3 and ultra-fine metal particles as the bonding material are being supplied from second supply holes 12.
Figure 4A:
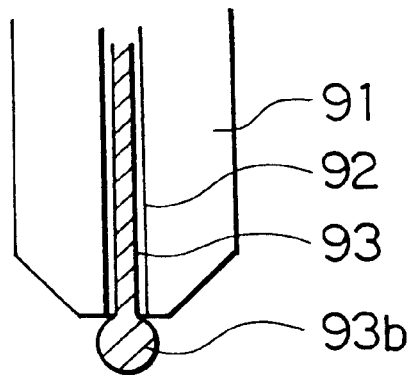
FIG. 4A and FIG. 4B are diagrams showing an example of connecting a bonding wire and a bonding pad according to a conventional wire bonding method.
Figure 4B:
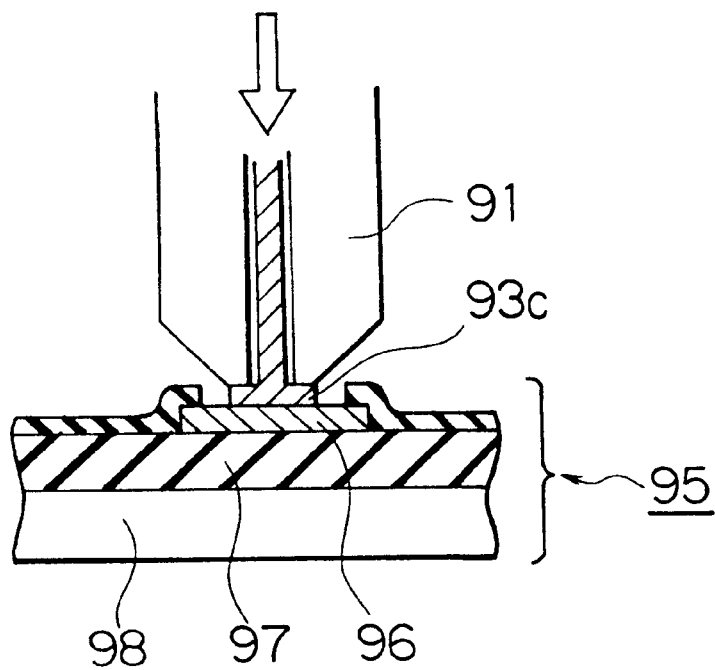

FIG. 3B shows that the bonding pad 6 and the ball 3b at the leading end of the bonding wire 3 are mutually contacted, and ultra-fine metal particles 9 as the bonding material are being supplied from the second supply holes 12. The ultra-fine metal particles 9 are accumulated in the neighborhood of the contacted point between the bonding pad 6 and the bonding wire 3. In FIG. 3B, reference numeral 9b denotes accumulated ultra-fine particles.

To use the ultra-fine metal particles, a metal material of a precious metal such as Au or Pt is heated to be vaporized in a pressurizing chamber to produce the ultra-fine metal particles. The capillary 1 and the semiconductor device 5 having the bonding pad 6 formed thereon are placed within a vacuum camber. The pressurizing chamber and the vacuum chamber are mutually connected via the second supply holes 12 of the capillary 1. The ultra-fine metal particles produced within the pressurizing chamber are transported into the vacuum chamber through the second supply holes 12 owing to a pressure difference between the pressurizing chamber and the vacuum chamber, and injected from the leading ends of the second supply holes 12 to, for example, the contacted face between the ball 3b and the bonding pad 6. Besides, the injected ultra-fine metal particles are accumulated in a gap area between the ball 3b and the bonding pad 6 to bond the ball 3b and the bonding pad 6. When a pressure difference in the second supply holes between the pressurizing chamber side and the vacuum chamber side is sufficiently large, the capillary 1 and the semiconductor device 5 can be provided under the atmosphere outside the vacuum chamber.

Since the relative positions of the first supply hole 2 and the second supply holes 12 are fixed, the ultra-fine metal particles can always be injected to a fixed point. In addition, the ultra-fine metal particles are supplied by injection, so that these particles are linearly supplied from the leading ends of the second supply holes 12 to the bonding pad 6. Thus, the ultra-fine metal particles as the bonding material can always be supplied stably to, e.g., the contact face between the ball 3b and the bonding pad 6, and the ball 3b and the bonding pad 6 can be bonded securely.

However, the ultra-fine metal particles supplied by injection as described above are linearly supplied and does not spread easily toward a point behind the ball 3b, for example. Therefore, to use this method, it is necessary to form many second supply holes 12 at multiple points symmetrical about the first supply hole 2. Otherwise, it is desirable to form the supply hole 12 in the form of a circular groove as shown in FIG. 2C.

And, this method accumulates the ultra-fine metal particles in a gap between the ball 3b and the bonding pad 6 to bond the ball 3b and the bonding pad 6, so that it is not necessary to apply any external force such as heat or ultrasonic oscillation to the bonding pad 6. Therefore, it is possible to prevent any damage to the semiconductor device on a portion near the bonding pad 6 due to an external force.

Description will be made of an embodiment of using a conductive paste. For example, a conductive paste which has metal such as Au or Pt contained in a solvent is dripped from the second supply hole 12 toward the contact face between the ball 3b and the bonding pad 6. The conductive paste is dripped by applying a pressure to the conductive paste. Therefore, the conductive paste is dripped along the second supply hole toward the contact face between the ball 3b and the bonding pad 6. Then, an area where the paste is dripped is heated, e.g., at about 150° C. to remove the solvent. This heating can be effected by, for example, a heating device mounted on the bonder.

In this method using the conductive paste, the conductive paste which is formed by mixing metal into a solvent has high fluidity. Therefore, the conductive paste dripped onto the bonding pad 6 can easily spread around the ball 3b to its behind from a point where the paste is dripped. Thus, the conductive paste as the bonding material can be uniformly and sufficiently charged between the ball 3b and the bonding pad 6 to improve the adhesion between the ball 3b and the bonding pad 6.

And, when the conductive paste is used for bonding, it is not necessary to apply an external force such as heating at a high temperature or ultrasonic oscillation. A heating temperature required in a conventional bonding method is, for example, about 300° C., but the heating temperature for removing the solvent in this embodiment is, for example, about 150° C. Besides, conductive pastes which do not need such heating are being developed. Accordingly, like the above-described ultra-fine metal particles, a damage to the semiconductor device on its part close to the bonding pad 6 due to an external force and the occurrence of a failure can be prevented.

And, when a conductive paste which does not need the thermal treatment is used, since this conductive paste does not contract, the occurrence of a stress due to such contraction can be prevented, and the occurrence of a defect in the contacted part between the bonding wire 3 and the bonding pad 6 can be prevented.

In the above embodiment, a precious metal such as Au or Pt was used as a material for the bonding material, because the precious metal is hardly oxidized and the bonded part can be secured with reliability. Besides, as long as a bonding material is conductive and does not cause a damage in the neighborhood of the bonding pad 6, a conductive resin having a conductive filler of a precious metal such as Au or Pt and other conductive materials can be used.

The capillary in the above-described embodiments can be mounted on conventional bonders. Therefore, bonding can be performed by the heating device or pressure mechanism of a conventional bonder. But, an external force such as heat or pressure is required to be controlled to a magnitude not applying a damage to any part of the semiconductor device 5 in the neighborhood of the bonding pad 6. Under such a limitation, the bonding force can be enhanced by applying heat or a pressure. Besides, the bonding of the bonding wire 3 and the bonding pad 6 with the bonding material may be performed in combination with the conventional bonding by applying heat or a pressure.

As described above, the electronic element producing method and apparatus of the present invention can bond the bonding pad and the bonding wire without applying a dynamic or thermal load in the neighborhood of the bonding pad of a semiconductor device or the like. Accordingly, electronic elements can be prevented from being damaged. And, in practical use after the production, the electronic elements such as a semiconductor device can be prevented from being damaged due to a dynamic or thermal load which might have been applied.

Besides, since the first supply hole for supplying a bonding wire and the second supplying hole for supplying a bonding material are integrally formed with the capillary, the electronic element producing method and apparatus of the present invention does not need to adjust the adhesive material supplying position or direction and can improve productivity of electronic elements.

What is claimed is:

1. An electronic element producing apparatus to connect a conductive wire to a bonding pad of an electronic element, comprising:

a bonding tool having an approximately cylindrical shape with its center axis in substantially parallel to the normal direction of the bonding pad of the electronic element, the bonding tool having a first supply hole formed along the center axis to supply the wire so as to contact the leading end of the wire to the bonding pad, and the bonding tool having at least one second supply hole formed so as to supply a bonding material into the neighborhood where the wire and the bonding pad are contacted so as to bond the wire and the bonding pad; and a holding means for holding the electronic element so as to face the bonding pad to the bonding tool.

2. An electronic element producing apparatus as set forth in claim 1, wherein the bonding tool has a plurality of the second supply holes, and the openings of the second supply holes are symmetrically formed about the first supply hole on the end face of the bonding tool.

3. An electronic element producing apparatus as set forth in claim 1, wherein the bonding tool has only one second supply hole, and the opening of the second supply hole is formed along the circumference about the opening of the first supply hole at the end face of the bonding tool.

4. An electronic element producing apparatus as set forth in claim 1, wherein when the bonding wire and the bonding pad are contacted with the axis of the first supply hole being substantially in parallel with the normal direction of the bonding pad, the second supply hole is formed along a circular cone with a contacted point as a vertex.

5. An electronic element producing apparatus as set forth in claim 1, further comprising means for supplying conductive ultra-fine particles as the bonding material to the second supply hole, the second supply hole is formed so as to deposit the ultra-fine particles into the neighborhood where the wire and the bonding pad are contacted.

6. An electronic element producing apparatus as set forth in claim 1, further comprising means for supplying a conductive paste as the bonding material to the second supply hole, the second supply hole is formed so as to deposit the ultra-fine particles into the neighborhood where the wire and the bonding pad are contacted.

7. An electronic element producing apparatus as set forth in claim 6, wherein the means for supplying the conductive paste supplies a conductive paste containing at least one element selected from Au or Pt.

8. An electronic element producing apparatus as set forth in claim 1, wherein the bonding tool further comprises a heating means for heating the periphery of the second supply hole so as to maintain fluidity of the bonding material in the second supply hole.

* * * * *

UNITED STATES PATENT AND TRADEMARK OFFICE
CERTIFICATE OF CORRECTION

PATENT NO.: 5,992,725

DATED: November 30, 1999

INVENTOR(S): Hidemitsu Egawa et al.

It is certified that an error appears in the above-identified patent and that said Letters Patent is hereby corrected as shown below:

Claim 6, column 12, line 2, change "ultra-fine particles" to --conductive paste--.

Signed and Sealed this

Fourteenth Day of November, 2000

*Attest:*

Q. TODD DICKINSON

*Attesting Officer*   *Director of Patents and Trademarks*